(12) United States Patent
Andreoli et al.

(10) Patent No.: US 6,291,140 B1
(45) Date of Patent: Sep. 18, 2001

(54) LOW-COST PHOTOPLASTIC CANTILEVER

(75) Inventors: Cornel Andreoli, Grabs (CH); Jürgen P. Brugger, MJ-Enschede (NL); Ute Dreschler, Kilchberg; Peter Vettiger, Langnau, both of (CH)

(73) Assignee: Olaf Ohlsson, Moresnet (BE)

( * ) Notice: Subject to any disclaimer, the term of this patent is extended or adjusted under 35 U.S.C. 154(b) by 0 days.

(21) Appl. No.: 09/300,990

(22) Filed: Apr. 28, 1999

(30) Foreign Application Priority Data

Apr. 28, 1998 (EP) .................................................. 98107662

(51) Int. Cl.⁷ .............................. G03C 5/00; G03F 7/34; H01L 21/027
(52) U.S. Cl. .................. 430/322; 430/320; 430/323; 430/324; 430/310; 438/52
(58) Field of Search ................................. 430/320, 394, 430/322, 323, 324, 309, 310, 302; 438/52, 53

(56) References Cited

U.S. PATENT DOCUMENTS

| | | | |
|---|---|---|---|
| 4,968,585 | * 11/1990 | Albrecht et al. | 430/320 |
| 5,045,439 | * 9/1991 | Maner et al. | 430/394 |
| 5,051,379 | * 9/1991 | Bayer et al. | 437/225 |
| 5,223,086 | * 6/1993 | Terada et al. | 438/51 |
| 5,272,913 | * 12/1993 | Toda et al. | 73/105 |

\* cited by examiner

Primary Examiner—Shean C. Wu
(74) Attorney, Agent, or Firm—Ronald L. Drumheller

(57) ABSTRACT

A method of manufacturing a cantilever with tip comprising the steps of forming a tip-like indent in a substrate, depositing a photoresist layer which fills said tip-like indent and covers at least a part of said substrate, and photolithographically structuring said photoresist layer to form said cantilever with tip out of said photoresist.

21 Claims, 2 Drawing Sheets

LOW-COST PHOTOPLASTIC CANTILEVER

TECHNICAL FIELD

The present invention concerns cantilevers and a method of making the same. These cantilevers are in particular suited for use in scanning probe systems, such as microscopes.

BACKGROUND OF THE INVENTION

An atomic force microscope (AFM), as well as a scanning force microscope (SFM) or a scanning tunneling microscope (STM), is an instrument in which a flexible cantilever of very small dimension is scanned across a surface. Conventional cantilevers are fabricated by micro machining techniques. Currently, there are two basically different ways to make cantilevers. The first uses thin films deposited onto a silicon substrate. The cantilever is then defined by lithography and etched into the thin film by wet or dry etching, followed by selective removal of the silicon underneath the cantilever. In the second fabrication method, the cantilever is micro machined out of a bulk silicon. This is done by etching through a window in a mask layer from the backside until the thickness equals twice the desired thickness of the cantilever. The cantilever is then defined and patterned by lithography on the front side and consecutively etched into the silicon until both etch fronts meet and the cantilever is released. Operating in reverse order is also possible by adding to the process a deposition step with a masking layer in order to protect the front side during backside thinning. The methods are described, for example, in Journal of Vacuum Science and Technology, Vol. B 9, No 2, March/April 1991, pp. 1353 to 1357.

The tip of a cantilever is the most crucial part. The resolution of a picture of a sample surface depends on the quality of the tip. That requires a well defined tip with known cone angle and sharp top apex.

Tips can also be either prepared as thin film tips using a silicon substrate or etched out of a silicon wafer by the following steps. Starting with a photolithographically patterned circular mask the silicon is etched away in the surroundings of the mask. Simultaneously, the mask is undercut until it is completely under etched. When the mask is released and the etching is stopped a silicon cone remains. An example for the microfabrication of a tip is disclosed in the article "Silicon cantilevers and tips for scanning force microscopy", J. Brugger et al., Sensor and Actuators A, Vol. 34, 1992, pp. 193–200. Large tips can be made by means of electroplating. To achieve this, a plating base is required to define the position where the tip is to be formed.

A disadvantage of these methods is that there remains residues of the etching. The usual fabrication of cantilevers with integrated tips needs at least three photolithographic steps and several dry and wet etching steps. The labour required for the fabrication is complex and expensive.

It is an object of the present invention to overcome the disadvantages of known approaches.

It is a further object of the present invention to provide a method for cost efficient fabrication of cantilevers with tip.

It is another object of the present invention to provide a simpler method for the fabrication of cantilevers with tip.

SUMMARY OF THE INVENTION

The present invention provides an efficient and easy method for fabricating cantilevers with tip. The method, according to the present invention, comprises the steps of forming a tip-like indent in a substrate to create a master, depositing a photoresist layer which fills said tip-like indent and covers at least a part of the substrate, and photolithographically structuring said photoresist layer to form said cantilever with tip out of said photoresist.

As outlined, the first step concerns the manufacturing of a master. This step is carried out just once. The master is reusable and a lot of cantilevers with tip can be produced using the same master. Only the other steps have to be repeated. There is a photoresist layer which is spin-coated over the master. This first photoresist layer fills also the tip-like indent, covers the master and has a planar surface. Photolithographically structuring means to expose the photoresist layer using a cantilever mask. After that, another photoresist layer together with the first photoresist layer might be deposited, exposed and developed, e.g. to make a body for the attachment. Finally, the cantilever with tip is lifted-off from the master. To improve this step a sacrificial layer might be placed between the master and the photoresist layer. Likewise, the cantilevers with tip might be delivered with the master to guarantee for a safe transport.

The inventive method allows to reduce the cost of manufacturing cantilevers since photoresist, such as SU-8, material cost is low and the process sequence is shortened. With the described method are no transfer steps necessary. The method is simple and the fabrication throughput is very high, because the major throughput contributions are only the two exposures and developments. Depending on the substrate and the cantilever size used in production, up to several thousand cantilevers could be fabricated on one substrate (master) with high yield and two exposures only.

The present invention further relates to an apparatus for batch-manufacturing of cantilevers with tip which comprises means for depositing a photoresist layer on a substrate with indent, means for applying and aligning masks, means for illuminating said photoresist layer through openings in said masks, and means for developing said photoresist layer of cantilevers with tip. It might further comprise means for depositing a second photoresist layer, means for illuminating said second photoresist layer through openings in a mask, and means for developing said second photoresist layer, providing a thickened mounting section.

It is an advantage of such an apparatus, that all fabrication steps can be carried out by one apparatus. This apparatus might work automatically and makes the fabrication processes simple and cost-efficient.

BRIEF DESCRIPTION OF THE DRAWINGS

The invention is described in detail below with reference to the following schematic drawings. It is to be noted that the Figures are not drawn to scale.

DESCRIPTION OF THE PREFERRED EMBODIMENT

Figure 1:
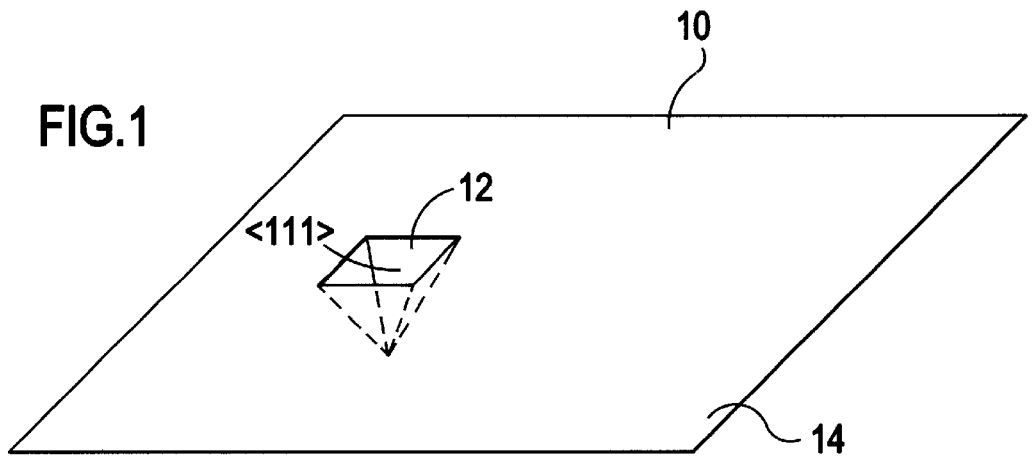
FIG. 1 is a schematic 3-dimensional view of a substrate with an <111> etched pyramidal mold as a master, in accordance with the present invention.

Before an embodiment of the present invention is described, the basic elements, in accordance with the present invention, are addressed.

Cantilevers

Cantilevers are well known elements which are used in wide ranges of research, production, storage of data or quality control and applied to interesting problems, e.g. in physics, biology, chemistry, biochemistry or biophysics. Examples for applications are: scanning probe storage systems, scanning probe lithography systems, test equipment comprising a scanning probe of array of probes, atomic resolution, high throughput inspection systems, scanning probe system used for the structuring of surfaces such as semiconductor chips and the like. The conventional fabrication processes for cantilevers arc described in the introductory portion. When dimensioning such cantilevers, one has to take into account specific parameters of the material used.

A cantilevers can have any shape. The cross-sectional shape perpendicular to the longitudinal axis of the cantilever could be rectangular, round, elliptical, or polygonal, for example.

Tip

As outlined, the tip of a cantilever is the most crucial part. For the tip the main issues arc geometry and chemistry. For cantilevers the primary issue is the mechanical performance. The word 'tip' herein used is meant to cover any kind of structure suited to interact directly or indirectly with a surface to be investigated, storage medium to be interacted with, or surfaces to be structured or modified. Usually, a cone or a ball-like element is used as tip. Different techniques are known to produce such tips. They can, for example, be made by isotropic wet or dry etching in combination with the oxidation of a single crystal material such as silicon. The sharper the tips are, the denser information on a storage medium can be stored, leading to increased capacity of a storage device. Or, in case of a scanning probe used to investigate a sample, the radius of the tip is directly related to the resolution of the scanning system.

Photoresist

Photoresist SU-8 is an epoxy-based, negative tone UV resist system with excellent sensitivity designed specifically for ultra-thick, high aspect-ratio microsystems. The primary applications are microfabricated mechanical structures and micro electro-mechanical systems (MEMS)-types. Examples are sensors, actuators, microfluidic components and molds for electroplating. One of its numerous advantages is the broad range of thicknesses which can be obtained in one spin. With single layer coatings, thicknesses of more than 500 $\mu$m can be achieved. Thicker resist layers can be made by applying double coatings or multiple coatings. The resist is exposed with a standard UV aligner and has an outstanding aspect-ratio, that means thickness to width up to 20. Since SU-8 is a negative tone resist, it allows for multiple exposure and development steps following each other to form 3-dimensional structures. This opens capabilities to form 3-dimensional structures by simple exposure and development steps. The photoresist is especially interesting as SU-8 has attractive mechanical properties. One of the key features of SU-8 is the low absorption in the visible range. Any other resist, negative tone or positive tone can be used instead. It should be taken into consideration that a positive tone needs to be crosslinked before the next layer is applied.

Figure 2:
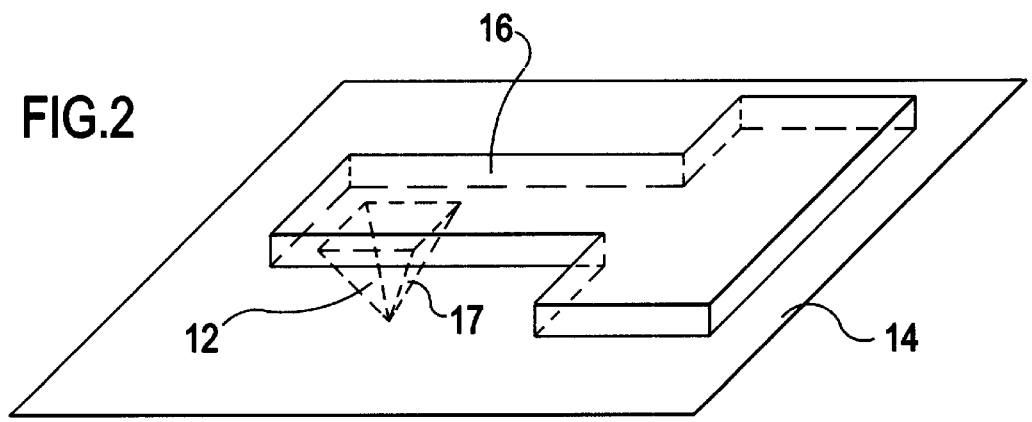
FIG. 2 is a schematic 3-dimensional view of the master of FIG. 1 with a first photolithographically structured photoresist layer, which covers the substrate and fills the etched pyramidal mold of FIG. 1.
Figure 3:
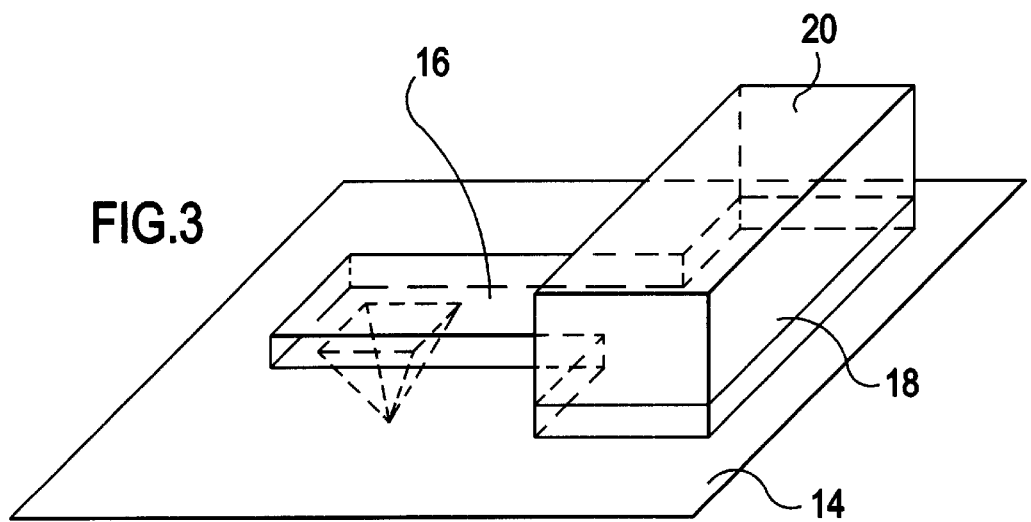
FIG. 3 is a schematic 3-dimensional view of the same master with a second structured photoresist layer.
Figure 4:
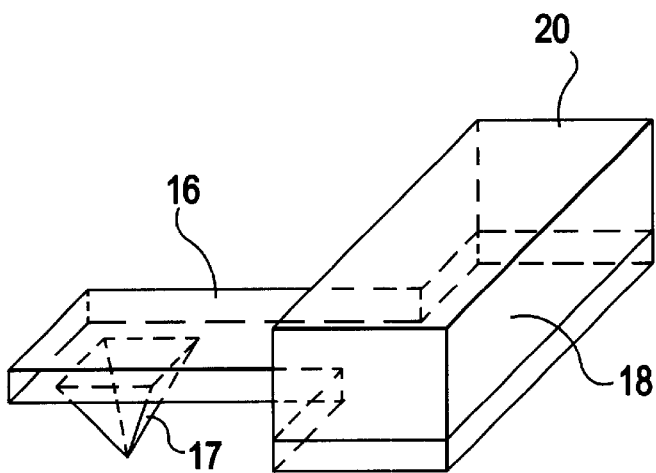
FIG. 4 is a schematic 3-dimensional view of the master and the released cantilever with tip and attachment section.
Figure 4:
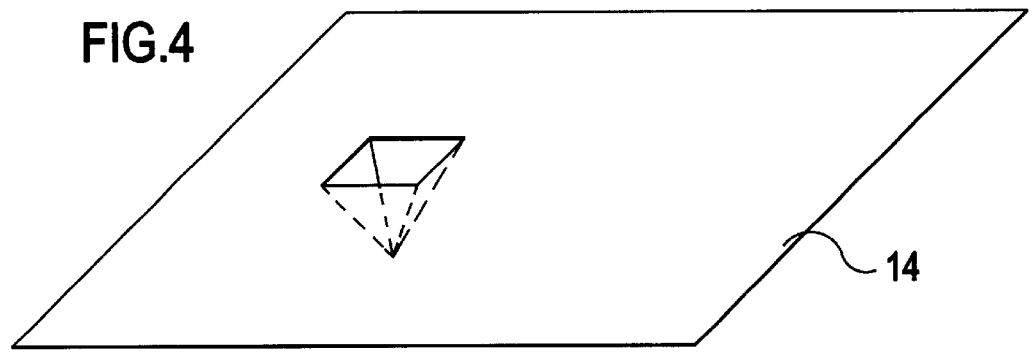

A preferred embodiment is directed toward making a cantilever with tip, as described with respect to FIGS. 1–4. As shown in FIG. 1, a substrate 10, e.g. Silicon, is patterned and KOH-etched to form a tip-like indent 12, or rather a <111> defined pyramidal shape 12 to determine the tip of a cantilever to be formed. Oxidation sharpening of the pyramidal shape by thermal oxidation might by done to achieve a sharper tip-like indent. Any other approach to form sharp and deep shapes in the substrate can be used. Note that the tip-like indent can have any shape. The substrate 10 with tip-like indent 12 serves as reusable mold master 14. Referring now to FIG. 2, the fabrication of a cantilever with tip begins with a sacrificial layer. For sake of clarity, this layer is not shown in the figure. The master 14 is coated by a very thin (about 10 nm) sacrificial layer (e.g. Aluminum) which can be removed chemically with good selectivity to photoresist SU-8. Aluminum can be removed by diluted KOH without attacking the photoresist SU-8. The master 14 is covered by an oxide from the oxidation sharpening and therefore not etched. After sacrificial layer coating, the master 14 is spin coated with a first layer 16 of photoresist SU-8 whose thickness corresponds to the required cantilever thickness, preferably between 1 $\mu$m and 10 $\mu$m. The spin coating of photoresist SU-8 is very conformable, hence the pyramidal shape 12 forming the tip is completely filled-up by SU-8 resulting in a solid SU-8 tip 17 after lift-off. The first layer 16 of photoresist SU-8 is exposed and developed by a cantilever mask (not shown in the figure) which has to be well aligned to the pyramidal shape 12 of the mold master 14. Note that the developing step can be done later. The FIG. 2 shows a 3-dimensional flat T-shaped SU-8 cantilever with the tip 17. The tip 17 is situated at the free end of the "T". Now referring to FIG. 3, a second photoresist SU-8 layer 18 is directly formed on the first layer 16, exposed and developed and define an attachment area or mounting section 20. This second photoresist SU-8 layer 18 has a cuboid shape and is much thicker than the first layer 16 of photoresist SU-8, preferably between 200 $\mu$m and 600 $\mu$m. The mounting section can be achieved by other methods as well. The crossbar of the "T" area of the first layer 16 is thickened by the cuboid shape of the second photoresist SU-8 layer 18. Both layers form the body of the cantilever comprising tip 17, mounting section 20 and a beam. Note that the word 'beam' herein is meant to cover any kind of structure suited to create a cantilever, e.g. rectangular cantilever, V-shaped cantilever or meander-shaped cantilever. Finally, as shown in FIG. 4, the whole part, now consisting of photoresist SU-8 layer 16 and photoresist SU-8 layer 18 is lifted-off from the mold master 14 by chemical removal of the sacrificial layer. Other means of removal can be used instead, which include different adhesion layers for physical removal pulling or thermal expansion removal. Compared to Silicon-based cantilevers other spring constants can be achieved when using SU-8. Although SU-8 based cantilevers have a performance similar to Silicon-based cantilevers, an additional coating of the tip 17, e.g. with an appropriate oxide or metal such as tungsten, might be advantageous. This provides a harder or a conductive tip. It is a disadvantage of this approach, however, that the tip's sharpness is reduced.

The fabrication process is the same for single and array-type cantilevers. The inventive method is well suited for making cantilever arrays, as will be addressed in the following.

An array with n cantilevers, each of which has at least one tip, can be made using a master with m tip-like indents. A substrate, e.g. Silicon, is patterned and etched to form m tip-like indents. Oxidation sharpening of the indents by thermal oxidation might by done to achieve very sharp tip-like indents. Note that the tip-like indents can have any shape. The substrate with m tip-like indents serves as reusable mold master. The fabrication of an array with n cantilevers with tip begins with a sacrificial layer. The master is coated by a very thin (about 10 nm) sacrificial layer (e.g. Aluminum) which can be removed as outlined. After sacrificial layer coating, the master is spin-coated with a first layer of photoresist SU-8 whose thickness corresponds to the thicknesses of the cantilevers to be formed. The m tip-like indents of the master are completely filled-up by SU-8. The first layer of photoresist SU-8 is exposed and developed by a suitable cantilever mask which has to be well aligned. After that, a second photoresist SU-8 layer is directly formed on the first layer 16, exposed and developed by another suitable cantilever mask and define a mounting section. This second photoresist SU-8 layer has a cuboid shape and is much thicker than the first layer of photoresist SU-8. Both layers form the body of the array with n cantilevers comprising beams, m tips and a common mounting section. Finally, the whole array with n cantilevers, now consisting of two photoresist SU-8 layers is lifted-off from the mold master by chemical removal of the sacrificial layer.

Cantilevers with tip can also be batch-manufactured. An apparatus with the following means is applicable. The means for depositing a first photoresist and/or a second photoresist layer might be nozzles to spray photoresist on a substrate or on a photoresist layer. A drive rotates the master. Masks can be applied and aligned automatically by a control system. Suitable lamps illuminate the photoresist layers through openings in these masks. Other nozzles spray developer on the photoresist layers. This is followed by a cleaning step with a cleaner. The cantilevers with tip can be removed mechanically or by a solvent or might be delivered together with the master.

What is claimed is:

1. A method of manufacturing a cantilever with tip, comprising the steps of:
   (a) forming a tip-like indent in a substrate;
   (b) depositing a photoresist layer which fills said tip-like indent and covers at least a part of said substrate;
   (c) photolithographically structuring said photoresist layer to form said cantilever with tip out of said photoresist layer; and
   (d) separating said cantilever with tip from said substrate.

2. The method of claim 1, whereby a layer is applied to said substrate before depositing said photoresist layer to improve said step of separating said cantilever with tip from said substrate.

3. The method of claim 2, whereby said layer applied to said substrate before depositing said photoresist layer comprises Aluminum.

4. The method of claim 1, whereby said photoresist layer comprises a photo-plastic material.

5. The method of claim 1, whereby said photoresist layer has a thickness of about 750 nm to 200 $\mu$m.

6. The method of claim 1, whereby said substrate comprises a semiconductor.

7. The method of claim 6, wherein said semiconductor comprises silicon.

8. The method of claim 1, whereby said tip-like indent is formed by means of etching.

9. The method of claim 1, whereby said substrate is a reusable master.

10. The method of claim 1, whereby said tip-like indent has a pyramidal shape.

11. The method of claim 1, whereby said tip-like indent is ball-shaped.

12. The method of claim 1, whereby said tip-like indent is sharpened using an oxidation technique.

13. The method of claim 1, whereby an additional photoresist layer is deposited and photolithographically structured such that a mounting section at said cantilever is obtained.

14. The method of claim 13, whereby said additional photoresist layer has a thickness of about 100 $\mu$m to 1200 $\mu$m.

15. The method of claim 13, whereby said additional photoresist layer has a thickness of between 200 $\mu$m and 600 $\mu$m.

16. Cantilever with a tip, a mounting section and a beam, wherein said cantilever and tip consist essentially of a photoresist.

17. The cantilever of claim 16, wherein said tip has a pyramidal shape.

18. The cantilever of claim 16, wherein said tip is ball-shaped.

19. The cantilever of claim 16, wherein said tip is coated.

20. The cantilever of claim 16, wherein said mounting section is thickened by an additional photoresist layer.

21. Cantilever with a tip, a mounting section and a beam, wherein the cantilever and tip are formed of a photoresist material with an optional outer coating of a different material covering at least a portion of the surface thereof.

* * * * *